United States Patent [19]
Akram et al.

[11] Patent Number: 5,741,547
[45] Date of Patent: Apr. 21, 1998

[54] METHOD FOR DEPOSITING A FILM OF TITANIUM NITRIDE

[75] Inventors: Salman Akram; Daniel A. Koos, both of Boise, Id.

[73] Assignee: Micron Technology, Inc., Boise, Id.

[21] Appl. No.: 589,924

[22] Filed: Jan. 23, 1996

[51] Int. Cl.$^6$ .................................................. C23C 16/34
[52] U.S. Cl. .......................................... 427/255.2; 427/590
[58] Field of Search .......................... 427/248.1, 255.2, 427/590

[56] References Cited

U.S. PATENT DOCUMENTS

| | | | |
|---|---|---|---|
| 5,139,825 | 8/1992 | Gordon et al. | 427/255.2 |
| 5,254,499 | 10/1993 | Sandhu et al. | 437/192 |
| 5,300,321 | 4/1994 | Nakano et al. | 427/248.1 |
| 5,378,501 | 1/1995 | Foster et al. | 427/255.2 |
| 5,393,565 | 2/1995 | Suzuki et al. | 427/255.2 |
| 5,399,379 | 3/1995 | Sandhu | 427/255.2 |
| 5,567,483 | 10/1996 | Foster et al. | 427/535 |

OTHER PUBLICATIONS

Sun et al., Thin Solid Films, 253 (1994), pp. 440–444 (month unknown).

"Nitrogen Doping of ZnSe by OMVPE Using a Novel Organometallic Precursor", Salman Akram, Ishwara B. Bhat and Andreas A. Melas, Journal of Electronic Materials, vol. 23, No. 3, 1994, pp. 259–262 (month unknown).

Comparison of chemical–vapor–deposition of TiN using tetrakis–diethylamino–titanium and tetrakis–dimethylamino–titanium, S.C. Sun, M. H. Tsai, Thin Solid Films 253 (1994) 440–444 (month unknown).

"Properties of chemical–vapor–deposited titanium nitride", J.B. Price, John O. Borland and Steve Selbrede, Thin Solid Films, 236 (1993) 311–318 (month unknown).

"LPCVD–TiN Using Hydrazine and TiCl$_4$", T. Suzuki, T. Ohba, Y. Furumura, and H. Tsutikawa, Jun. 8–9, 1993 VMIC Conference. pp. 418–423.

"Growth and Properties of LPCVD TiN for ULSI", Arthur Sherman, International Conference on Solid State Devices and Materials, Yokohama, 1991, pp. 177–179 (month unknown).

*Primary Examiner*—Shrive Beck
*Assistant Examiner*—Tim Meeks
*Attorney, Agent, or Firm*—Wells, St. John, Roberts, Gregory & Matkin P.S.

[57] ABSTRACT

A method of depositing a film of titanium nitride on a substrate which includes, positioning the substrate within a chemical vapor deposition reactor chamber which is maintained at a predetermined temperature and pressure; combining a gaseous source of nitrogen with a gaseous source of titanium to form a reactant gas mixture having complementary reactant molecules; and delivering the complementary reactant molecules within the chemical vapor deposition reactor from a selected distance from the substrate of greater than 1 cm. which facilitates the formation of titanium nitride film on the substrate having a given surface roughness which is at least 50% rougher than the titanium nitride film deposited using the same gaseous sources of titanium and nitrogen and which are combined under the same temperature and pressure condition but which are delivered to the surface of the substrate from a distance of about 1 cm. The gaseous sources of nitrogen may include phenylhydrazine.

2 Claims, 1 Drawing Sheet

METHOD FOR DEPOSITING A FILM OF TITANIUM NITRIDE

TECHNICAL FIELD

This invention relates generally to the formation of rough titanium nitride films using low pressure chemical vapor deposition techniques.

BACKGROUND OF THE INVENTION

The compound titanium nitride [TIN] can be used in numerous applications because it is extremely hard, substantially chemically inert, an excellent electrical conductor, possesses optical characteristics similar to those of gold, and has a melting point of approximately 3,000 degrees C.

While titanium nitride has been utilized for various purposes through the years, it has been found particularly useful in the manufacture of integrated circuits. In particular, titanium nitride has been found to be useful because it can withstand the processing temperatures and most of the caustic agents used in semiconductor processing techniques. Still further, titanium nitride functions as an excellent barrier layer against the diffusion of dopants between semiconductor layers. Moreover, titanium nitride has also been found to be an excellent ohmic contact with other conductive layers.

Conventional processes for producing titanium nitride films have included at least six techniques which utilize precursor gases which, when combined together under predetermined temperature and pressure conditions, form titanium nitride which is deposited as a thin film and which has low bulk resistivity. These techniques are summarily outlined in U.S. Pat. No. 5,399,379 to Sandhu, the teachings of which are incorporated by reference herein.

While the prior art methods and other practices have operated with varying degrees of success, there have been several shortcomings attendant with the prior art methods which have detracted from their usefulness. More specifically, the prior art processes have suggested that it is desirable to place at least one of the precursor gas inlets at a position which is very close to the target substrate surface. This positioning of the precursor gas inlet at this location appears to inhibit or otherwise discourage some gas phase reactions. It is hypothesized that the gas phase inhibition prevents the creation of various contaminants and other anomalies in the resulting titanium nitride film. An improvement in the process for depositing a titanium nitride film on a selected target substrate is the subject of the present invention.

BRIEF DESCRIPTION OF THE PREFERRED EMBODIMENT

Figure 1:
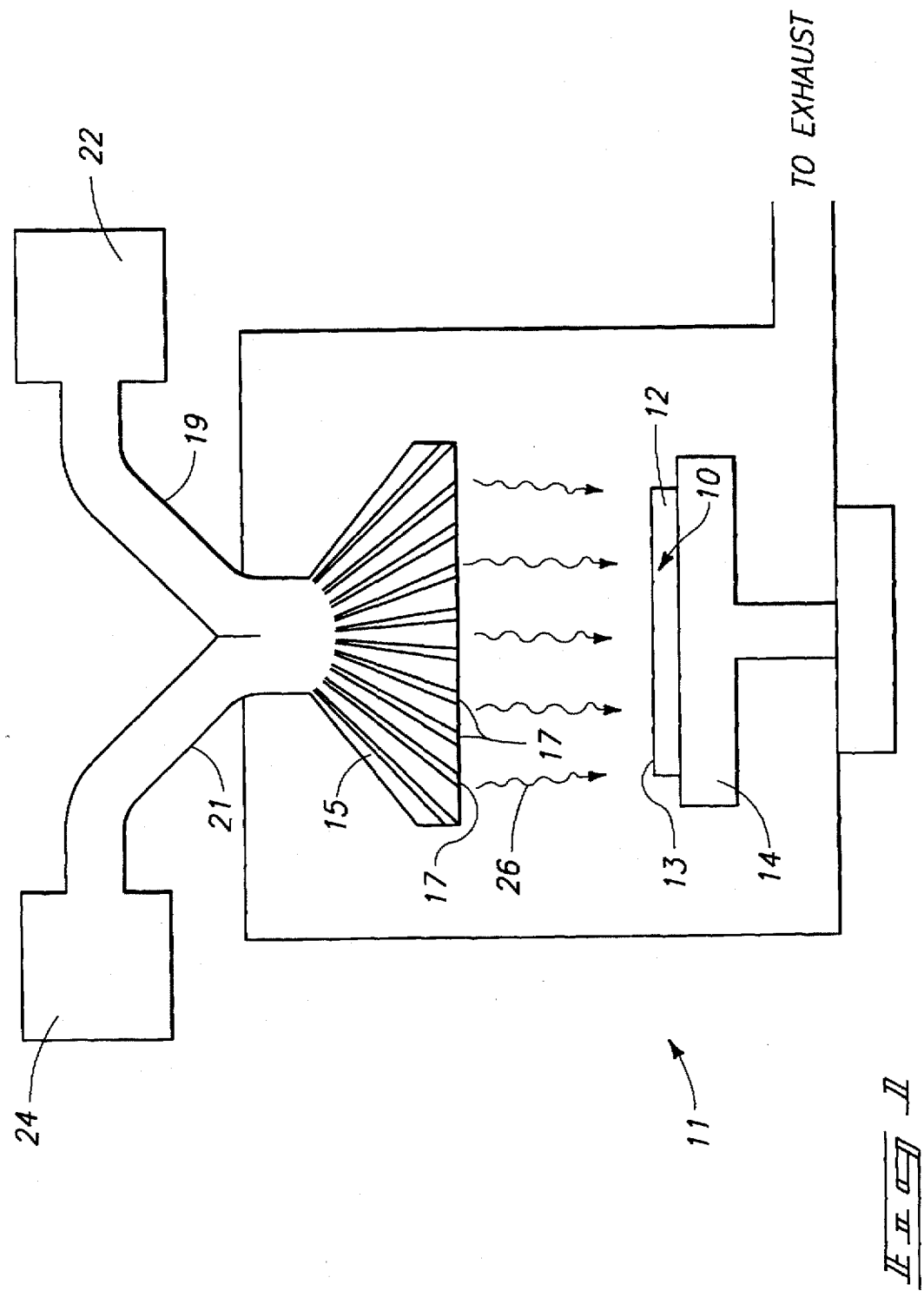
FIG. 1 is a greatly simplified diagrammatic, sectional view of a chemical vapor deposition reactor chamber and associated shower head employed in the method of the present invention.

This disclosure of the invention is submitted in furtherance of the constitutional purposes of the U.S. Patent laws "to promote the progress of science and the useful arts" [Article 1, Section 8].

In accordance with one aspect of invention, a method for depositing a film of titanium nitride on a substrate comprises:

positioning a substrate within a chemical vapor deposition reactor chamber, the substrate having a surface;

combining a gaseous source of nitrogen with a separate gaseous source of titanium to form a reactant gas mixture having complementary reactant molecules in a gas phase; and delivering the reactant gas mixture within the chemical vapor deposition reactor chamber to the surface of the substrate and providing temperature and pressure conditions within the chemical vapor deposition reactor chamber effective to deposit a film of titanium nitride on the substrate surface, the complementary reactant molecules of the mixture combining when in the gas phase to form titanium nitride which transports to the substrate surface and deposits the titanium nitride film thereon under the temperature and pressure conditions, the complementary reactant molecules having a given number of collisions at the temperature and pressure conditions, the gaseous sources of nitrogen and titanium being combined at, and the reactant mixture being delivered from, a selected distance from the substrate surface which is greater than 1 cm., the deposited titanium nitride film having a surface roughness which is greater than a surface roughness of a titanium nitride film deposited using the same nitrogen and titanium source gases under the same temperature and pressure conditions, but combined at a distance from the substrate surface which is about 1 cm.

Still another aspect of the present invention includes, a method for depositing a film of titanium nitride on a substrate which has a surface comprising:

positioning the substrate within a chemical vapor deposition reactor chamber which has been provided with a given temperature and pressure;

providing gaseous phenylhydrazine into the chemical vapor deposition reactor chamber;

providing a gaseous titanium organometallic precursor into the chemical vapor deposition reactor chamber, the gaseous phenylhydrazine and titanium organometallic precursor comprising complementary reactant molecules within the chemical vapor deposition reactor chamber; and delivering the complementary reactant molecules to the substrate surface from a selected distance of greater than 1 cm., the temperature and pressure conditions of the chemical vapor deposition reactor chamber effective to cause the complementary reactant molecules to combine at the selected distance and subsequently deposit the film of titanium nitride with a given surface roughness on the surface of the substrate, the given surface roughness of the titanium nitride deposited being greater than the surface roughness of titanium nitride film deposited by combining the same gaseous phenylhydrazine and gaseous titanium organometallic precursor under the same temperature and pressure conditions and delivering the resulting complementary reactant molecules to the substrate surface from a distance of about 1 cm.

In still a further aspect of the present invention relates to a method for depositing a film of titanium nitride on a substrate surface comprising:

positioning the substrate within a chemical vapor deposition reactor chamber, the substrate maintained at a temperature of about 300 degrees to about 500 degrees C. within the chemical vapor deposition reactor chamber, and wherein the chemical vapor deposition reactor chamber is maintained at a temperature of about 300 to about 400 degrees C., and a pressure of about 0.5 to about 10 Torr;

providing a selected quantity of gaseous titanium from an organometallic source, and wherein the gaseous titanium organometallic is selected from the group consisting of tetrakis-dialklyamidotitanium (such as tetrakis-dimethylamidotitanium or tetrakis-diethylamidotitanium) which is delivered at a flow rate of about 4 to 6 sccm. to the chemical vapor deposition reactor chamber;

providing a selected quantity of gaseous ammonia for reaction with the titanium, the gaseous ammonia being provided from an inorganic source and supplied to the chemical vapor deposition reactor chamber at ambient temperatures, and at a flow rate of about 10 to about 1000 sccm.;

combining the gaseous titanium and ammonia into a reactant gas mixture forming complementary reactant molecules in a gas phase, the complementary reactant molecules having a given number of collisions in the gas phase at the temperature and pressure conditions provided for in the chemical vapor deposition reactor chamber;

delivering the reactant gas mixture within the chemical vapor deposition reactor chamber, while simultaneously maintaining the chemical vapor deposition reactor chamber at the temperature and pressure conditions for a time period sufficient to cause the complementary reactant molecules to combine and deposit the film of titanium nitride on the surface of the substrate, the reactant gas mixture delivered from a selected distance greater than 1 cm. which is effective to form the film of titanium nitride having a predetermined surface roughness, the surface roughness of the titanium nitride deposited being about 100 percent rougher than the surface roughness of titanium nitride deposited by combining the same gaseous titanium organometallic and ammonia under the same temperature and pressure conditions and delivering the resulting complementary reactant molecules to the substrate surface from a distance of about 1 cm., the complementary reactant molecules delivered to the surface of the substrate by a shower head.

In another aspect of the present invention, the present method finds usefulness in obtaining titanium nitride films having a predetermined roughness and which could be utilized in the fabrication of a capacitor electrode, or on the other hand, employed to increase the overall capacitance of these same devices because of their rough surface texture.

The improved method for depositing a film of titanium nitride on a substrate can be implemented by utilizing the assembly which is depicted in FIG. 1. The preferred method takes place in a chemical vapor deposition reactor chamber 11 in which the pressure has been reduced from ambient to about 0.5 to about 10 Torr. Further, the temperature of the chemical vapor deposition reactor chamber is increased to about 300 to 400 degrees C. A substrate 10, which is identified as a silicon wafer 12, hereinafter has an upwardly facing surface 13. The silicon wafer 12 is mounted on a susceptor 14 which is heated to a temperature of about 300 degrees to about 500 degrees C. In the practice of the preferred method, the temperature of the substrate would normally be maintained at a higher level than the temperature of the chemical vapor deposition reactor chamber 11. Further, the method of the present invention contemplates the use of a shower head 15 for the delivery of a reactant gaseous mixture which will be discussed in greater detail in the text which follows. The shower head 15 is of conventional design having a plurality of passageways 17 formed therein and which facilitates the escape of a reactant gaseous mixture into the chemical vapor deposition chamber 11. The shower head 15 is mounted in fluid flowing relationship with a first gas supply conduit 19, and a second gas supply conduit 21, respectively. Additional gas supply conduits can also be connected to the shower head 15 and which provide a residual gas which enchances the transport of a reactant mixture to the silicon wafer 12. The reactant mixture is discussed in detail hereinafter. The relative distance between the shower head and the silicon wafer 12, which is borne by the susceptor 14, may be selectively adjusted for the purposes which will be discussed in greater detail hereinafter. Optionally a heater element (not shown) may be mounted in heat transmitting relation relative to the first and second gas supply conduits for purposes of providing heat energy to a supply of gas which is passing therethrough. The heat energy can be used to facilitate the gas phase reactions which will be described, below. The heat energy also prevents condensation from forming on the gas supply conduits.

A source of gaseous titanium 22 is connected in fluid flowing relationship relative to the first gas supply conduit 19. The source of gaseous titanium 22 may include a titanium organometallic precursor which is selected from the group which includes TDMAT (TiNMe$_2$)$_4$) and TDEAT (Ti [NET$_2$]$_4$) for example. The titanium organometallic precursor is injected or otherwise supplied to the chemical vapor deposition reactor chamber 11 at a flow rate of about 4 to about 6 sccm. Carrier gases can also be used to facilitate the transport of the precursor. Additionally, a source of nitrogen 24 is connected in fluid flowing relation relative to the second gas supply conduit 21. In the practice of the present method, the source of nitrogen 24 may be selected from the group which includes gaseous ammonia (NH$_3$) and phenylhydrazine (C$_6$H$_5$) HN—NH$_2$ which are individually combined together with the source of gaseous titanium 22 to provide a gaseous reactant mixture 26 having complementary reactant molecules which collide a given number of times while in the gaseous phase and at the temperature and pressure conditions provided for in the chemical vapor deposition reactor chamber.

In the practice of the preferred method, as shown in FIG. 1, the sources of gaseous titanium 22 and ammonia or phenylhydrazine 24, as the case may be, are reactively combined together to form the gaseous reactant mixture 26 within the chemical vapor deposition reactor chamber 11. However, it should be recognized that these same gaseous materials may be combined together to form the gaseous reactant mixture externally of the chemical vapor deposition reactor. Regardless of where the reactive combination occurs, that is, within or outside of the chemical vapor deposition reactor chamber 11, the gaseous reactant mixture will be delivered by means of the shower head 15 at a preferred distance of about 5 cm. from the surface 13 of the silicon wafer 12 when the source gases are delivered at the temperature and pressures identified above. This distance from the surface 13 of the silicon wafer 12 facilitates the collision of the reactant molecules at a rate which is about 100 times greater than the number of collision which would occur under the identical temperature and pressure conditions, and at a distance of about 1 cm. When these temperature and pressure conditions are met, the resulting titanium nitride film deposited has a surface roughness which is about 50% greater than what would be deposited on the silicon wafer 12 under identical circumstances when the gaseous reactant mixture is delivered to the substrate surface from a distance of about 1 cm.

It has further been discovered that providing a reactant gas mixture 26 at the preferred distance, noted above, facilitates the deposit of a particularly desirable film of titanium nitride having a high density. In particular, the film of titanium nitride deposited has less than three percent carbon and one percent oxygen impurities.

EXAMPLE

Experimental results were obtained for the present method as set forth in further detail, below. A chemical vapor deposition reactor chamber 11 having a shower head 15 and a susceptor 14 were provided. Further, a gaseous source of nitrogen 24 and titanium organometallic 22 were connected in fluid flowing relationship to the shower head 15. In this example, the source of titanium organometallic was selected from the group of TDEAT or TDMAT. The source of titanium organometallic was supplied at a flow rate of about 4 to about 6 sccm. Further, the nitrogen source was phenylhydrazine which was supplied at a flow rate of about 1 to about 8 sccm. In addition, a source of hydrogen or argon gas was provided and acted as both a carrier and a residual gas for the chemical vapor deposition chamber 11. The hydrogen or argon gas was supplied in amounts of approximately 500 to 10,000 sccm. The silicon wafer 12 was heated to a temperature of about 350 degrees C. and the pressure of the chemical vapor deposition reactor chamber was maintained at about 0.5 Torr to about 10 Torr. Still further, the distance between the substrate and the shower head was adjusted to be about 5 cm. At this distance it was calculated that the complementary reactant molecules had about 7000 collisions per cubic centimeter.

Following exposure of the silicon wafer 12 to the experimental conditions identified above, the substrate was examined microscopically and compared with a second substrate which was coated with a film of titanium nitride utilizing the identical source gases and which were reactively combined and delivered from a shower head 15 at a distance of about 1 cm. This comparative analysis revealed that the surface roughness of titanium nitride deposited utilizing the former conditions was approximately 50% greater than that achieved by positioning the shower head at a distance of about 1 cm. from the surface of the substrate.

It is hypothesized that the delivery of the complementary reactant molecules from a distance which facilitates the gas phase collisions which were discussed earlier has the effect of depositing a film of titanium nitride which has increased roughness. This is a highly desirable characteristic. Further, this same film has an improved density and improved conductivity with a typical conductivity between 100–200 microohm-cm. The improved conductivity suggests that the film of rough titanium nitride deposited would be useful as an electrode in semiconductor applications. This rough titanium nitride could also be substituted in place of rough polysilicon in semiconductor applications. Similar results were obtained when $TiCl_4$ was supplied at a flow rate of about 10 sccm. and reactively combined with phenylhydrazine which was supplied at a flow rate of about 40 sccm. In this experimental environment, the chemical vapor deposition reactor was maintained at about one 1 to about 100 mTorr, and at a temperature of about 400° C. to about 700° C. Further, hydrogen or argon was used as an additional source gas and was supplied at a flow rate of about 500 sccm. to about 2,000 sccm. Upon further analysis of the specimens processed under these experimental conditions, similar increased surface roughness was observed. Additionally, the titanium nitride deposited had a resistivity of approximately 100 to about 500 microohms per cm.

It will be apparent to those having ordinary skill in the art of chemical vapor deposition techniques that modifications and changes may be made thereto without affecting the scope and spirit of the invention as claimed. For example, other organometallic titanium compounds will likely react in a similar manner and with similar results. It is also to be understood that the process parameters disclosed herein are meant to be illustrative and are not meant to be limiting. In addition, it should be understood that titanium nitride may be deposited on a variety of substrates and are not limited semiconductor substrates.

In compliance with the patent statute, the invention has been described in language more or less specific as to its structural and methodical features. It is to be understood, however, that the invention is not limited to the specific features shown and described since the means herein disclosed comprise preferred forms of putting the invention into effect. The invention is, therefore, claimed in any of its forms or modification within the proper scope of the appended claims appropriately interrupted in accordance with the Doctrine of Equivalents.

We claim:

1. A method of depositing and controlling relative surface roughness of a titanium nitride layer comprising:

selecting a relative titanium nitride layer surface roughness;

positioning a substrate having an outer surface within a chemical vapor deposition reactor;

providing a gas delivery shower head spaced from the outer surface at a selected distance greater than 1 cm and less than or equal to about 5 cm, said distance being determined at least in part by the selected titanium nitride layer surface roughness;

injecting a gaseous titanium organometallic compound and at least one of ammonia and phenylhydrazine through the shower head to chemical vapor deposit a titanium nitride layer having the selected surface roughness over the outer surface.

2. A chemical vapor deposition method of controlling relative surface roughness of a titanium nitride layer comprising selecting a gas delivery shower head distance from a substrate surface which is greater than 1 cm and less than about 5 cm for achieving a selected surface roughness, and injecting a gaseous titanium organometallic compound and phenylhydrazine through the shower head to chemical vapor deposit a titanium nitride layer having the selected surface roughness on the substrate surface.

* * * * *